US009429603B2

(12) United States Patent
Detert

(10) Patent No.: US 9,429,603 B2
(45) Date of Patent: Aug. 30, 2016

(54) METHOD AND DEVICE FOR DETECTING AIRCRAFT RADIO SIGNALS TRANSMITTED IN THE SAME CHANNEL SIMULTANEOUSLY

(75) Inventor: Thorben Detert, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/237,025

(22) PCT Filed: Jul. 17, 2012

(86) PCT No.: PCT/EP2012/063983
§ 371 (c)(1),
(2), (4) Date: Feb. 4, 2014

(87) PCT Pub. No.: WO2013/023857
PCT Pub. Date: Feb. 21, 2013

(65) Prior Publication Data
US 2014/0167734 A1  Jun. 19, 2014

(30) Foreign Application Priority Data

Aug. 16, 2011 (DE) .................. 10 2011 080 999

(51) Int. Cl.
H04B 3/46 (2015.01)
H04K 1/00 (2006.01)
H03K 9/00 (2006.01)
G01R 23/16 (2006.01)
H03D 1/00 (2006.01)
H04L 1/00 (2006.01)
G06F 1/00 (2006.01)

(52) U.S. Cl.
CPC .............. G01R 23/16 (2013.01); H03D 1/00 (2013.01); H04L 1/00 (2013.01); G06F 1/00 (2013.01); H04L 2201/00 (2013.01)

(58) Field of Classification Search
CPC ..... G01R 23/16; H04L 1/00; H04L 2201/00; G06F 1/00; H03D 1/00
USPC ......................... 375/260, 316, 228
See application file for complete search history.

(56) References Cited

U.S. PATENT DOCUMENTS 6,960,996 B2  11/2005 Sackl
7,376,204 B1   5/2008 Music
(Continued)

FOREIGN PATENT DOCUMENTS

DE   10 2007 037 105 A1   11/2008

OTHER PUBLICATIONS

International Search Report issued in corresponding application No. PCT/EP2012/063983 mailed Nov. 6, 2012.

Primary Examiner — Farhana Hoque
(74) Attorney, Agent, or Firm — Carter, DeLuca, Farrell & Schmidt, LLP

(57) ABSTRACT

A method for detecting at least two amplitude-modulated transmitted signals contained in a received signal within the same frequency channel with respectively different frequency displacements, which determines from the received signal a modified received signal by means of a nonlinear signal processing. Following this, the spectrum of the modified received signal is determined by means of Fourier transform, and at least two transmitted signals contained in the received signal are detected if at least two first spectral lines each associated with carrier signals are significantly distinguishable within the determined spectrum from spectral components associated with noise signals and payload signals.

19 Claims, 4 Drawing Sheets

(56) References Cited

U.S. PATENT DOCUMENTS

| | | |
|---|---|---|
| 7,428,270 B1 | 9/2008 | Dubuc et al. |
| 2008/0162060 A1* | 7/2008 | Novikov .......... G01R 31/31709 702/69 |
| 2010/0054352 A1 | 3/2010 | Huttunen et al. |
| 2010/0067570 A1* | 3/2010 | Lipp ........................ H03D 1/00 375/228 |
| 2012/0183030 A1* | 7/2012 | Turunen .............. H04L 27/0006 375/224 |

* cited by examiner

METHOD AND DEVICE FOR DETECTING AIRCRAFT RADIO SIGNALS TRANSMITTED IN THE SAME CHANNEL SIMULTANEOUSLY

The invention relates to a method and a device for detecting especially amplitude-modulated aeronautical radio signals transmitted simultaneously in the same frequency channel.

In the context of aeronautical radio communication between the pilot disposed in an aircraft and the air-traffic control personnel disposed in a ground station or respectively between pilots disposed in different aircraft, voice transmission takes place on a standardised, nominal frequency with amplitude-modulated transmitted signals. In rare cases, several radio transmissions can be implemented simultaneously with an identical nominal frequency. Since this represents a critical condition, which can, under some circumstances, lead to navigational errors by one or more pilots, this critical condition must, for safety reasons, be detected and notified to the respective pilots and to the air-traffic control personnel.

A method and a system for detecting a simultaneous transmission of amplitude-modulated transmitted signals in aeronautical radio communication are known from US 2010/0067570 A1. In this document, the effect of beats, which occur in the case of the additive superposition of two oscillations with approximately identical amplitude and slightly different frequency, is exploited. The amplitude of the summated signal generated by superposition varies with the frequency of the beats, which corresponds to the difference between the two slightly different frequencies. The amplitude of the summated signal, which is time variable corresponding to the beat frequency, is identified via a Fourier transform as a spectral line in the spectrum of the summated signal. The method and system described in that context is disadvantageously unsuitable for superposed transmitted signals of different amplitude, such as those which typically occur in the case of different distances between two transmitters and one receiver.

Figure 1A:
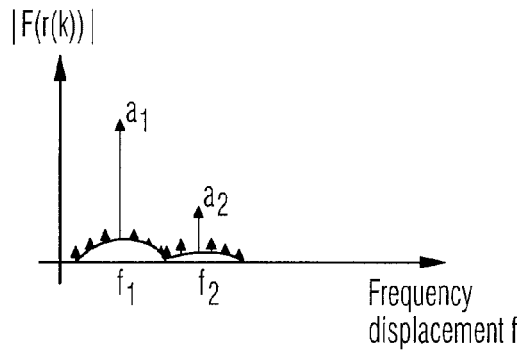

An identification of multiple transmissions in the same frequency channel of the aircraft radio based on the identification of the spectral lines of the carriers respectively associated with the simultaneously transmitted radio signals with different frequency displacements of the radio signals caused by the Doppler effect or oscillator distortions can only function satisfactorily in the case of radio signals with high reception amplitudes of the carrier, in which the spectral lines of the carriers project significantly above the spectral lines of the non-periodic spectral components of the voice signal in the upper and lower sideband and the spectrum of the superposed noise (see amplitudes $a_1$ and $a_2$ of the spectral lines of the carriers in the amplitude spectrum of FIG. 1A). By contrast, if the spectral lines of the carriers of the remaining radio signals in the spectral components of the voice and noise signal disappear in the associated upper and lower sidebands, a detection of further radio signals in the received signal is only possible with difficulty (see the comparatively small amplitude $a_2$ of the spectral line of the carrier of the second radio signal, which almost disappears in the upper and lower sideband in the amplitude spectrum of FIG. 1B).

The object of the invention is therefore to provide a method and a system for detecting a simultaneous transmission of transmitted signals in the same frequency channel, which can be used especially in the case of a different received amplitude of the two transmitted signals.

The object is achieved by a method according to the invention for detecting at least two transmitted signals contained in a received signal with different frequency displacement with the features of claim 1 and by the device according to the invention for detecting at least two transmitted signals contained in a received signal with different frequency displacement with the features of claim 16. Advantageous technical developments are specified in the respectively dependent claims.

According to the invention, the received signal composed of at least two transmitted signals is supplied to a nonlinear signal processing function. From the resulting, modified received signal, the associated spectrum is determined by means of Fourier transform. As a result of the nonlinear signal processing, the spectrum of the modified received signal contains not only spectral lines at the carrier frequencies and in the associated upper and lower sidebands of the two transmitted signals, but also spectral lines at multiples of the carrier frequencies, in the allocated upper and lower sidebands, at the individual intermodulation frequencies and in the allocated upper and lower sidebands.

While the spectral lines of the carrier of a transmitted signal which provides a low reception amplitude do not typically project from the spectral lines in the associated upper and lower sidebands without the use of a nonlinear signal processing and cannot therefore be identified, with the use of a nonlinear signal processing, at least one additional spectral line is added at an intermodulation frequency, which, because of the nonlinear signal processing, provides an amplitude, which is dependent upon the largest amplitude of all transmitted signals contained in the received signal and accordingly projects above all of the spectral lines of the associated upper and lower sideband and can be identified unambiguously. Accordingly, a simultaneous reception of at least two, especially amplitude-modulated transmitted signals is detected according to the invention by identifying at least two spectral lines, —the spectral line of the carrier with the largest amplitude and the spectral line of an intermodulation product—which project significantly above all of the spectral lines in the individual upper and lower sidebands.

To ensure that the spectral lines with carrier frequencies of transmitted signals with comparatively low reception amplitudes, which, under some circumstances, do not project above the spectral lines in the associated upper and lower sidebands, can still be identified unambiguously, the spectral lines in the upper and lower sidebands arranged symmetrically relative to the spectral line at the carrier frequencies and at the individual intermodulation frequencies respectively are preferably identified and blanked out of the spectrum.

For this purpose, in a first step, the entire received spectrum is preferably restricted to the frequency range required for the detection of several transmission frequencies in one received signal. For example, with the use of a quadratic signal processing as the nonlinear signal processing, the spectral range is preferably restricted to the frequency range in which the second harmonic of the transmitted signals contained in the received signal are positioned. For instance, with the use of a modulus function as the nonlinear signal processing, the restriction of the spectral range is preferably applied to the frequency range surrounding the direct signal components.

Now, within this restricted spectral range, starting from the spectral line with the largest amplitude, which represents the spectral line of the carrier with the largest amplitude, the spectral line positioned with regard to the spectral line with the largest amplitude in mirror-image symmetry to the spectral line with the next smallest amplitude is sought. If a spectral line, of which the frequency interval relative to the spectral line with the largest amplitude differs by a maximum of a predetermined threshold value from the frequency interval between the spectral lines with the largest amplitude and the spectral lines with the next smallest amplitude, a pair of spectral lines exist in the respective upper and lower sideband, positioned in a frequency-symmetrical manner relative to the spectral line with the largest amplitude, which are referred to below as second spectral lines. This pair of second spectral lines is blanked out from the restricted spectral range.

The modified, restricted frequency range is preferably investigated for further spectral line pairs positioned in a frequency-symmetrical manner relative to the spectral line with the largest amplitude and modified in the same manner. When all of the spectral lines present in the restricted spectral range have been investigated in this manner with regard to frequency symmetry relative to the spectral lines with the largest amplitude, the spectral line with the largest amplitude is marked as an asymmetrical spectral line—that is, a spectral line associated with a carrier or an intermodulation product. Asymmetrical spectral lines marked in this manner are referred to below as first spectral lines.

All other spectral lines still existing in the restricted frequency range are then preferably investigated with regard to the existence of spectral-line pairs positioned in a frequency-symmetrical manner, starting with the spectral line with the next lowest amplitude. If any such spectral-line pairs positioned in a frequency-symmetrical manner exist, these are blanked out from the restricted spectral range, and the associated spectral line positioned in the centre of the frequency symmetry is marked as an asymmetrical spectral line.

The unambiguous identification of first spectral lines respectively at a carrier frequency and/or an intermodulation frequency within the voice and noise components contained in the received signal should preferably be determined on the basis of additional statistical tests:

In a significance test, the amplitude of every identified first spectral line is preferably compared with a selected significance level above the mean value of the sampled values of the voice and noise signal components still contained in the received signal. If the amplitude of the respective, identified first spectral line is disposed above the selected significance level, a spectral line of a carrier associated with a transmitted signal is present at a carrier frequency, at multiples of a carrier frequency and/or at one of the intermodulation frequencies. The significance test is suitable only for a received signal with a pronounced signal-noise interval, in which the spectral lines of the carriers and the associated intermodulation products are disposed unambiguously and therefore significantly above the noise floor.

Cyclostationary property detection is advantageously suitable for the identification of first spectral lines which are associated with carrier signals or respectively intermodulation products with a low signal-noise interval. With reference to US 2010/0054352 A1, of which the disclosure is included here as a component of the present patent application, a signal provides cyclostationary properties if its autocorrection function is periodic over time. While a noise signal provides a time-invariant autocorrection function because of its stochastic, a pure voice signal provides an autocorrection function with a number of harmonic spectral components corresponding to the number of periodicities over time because of its harmonic spectral components. The presence of at least one periodicity in the autocorrelation function is identified by means of Fourier transform.

A further or alternative statistical test for identifying spectral lines which are associated with carrier signals or intermodulation products of carrier signals in a noise floor with a low signal-noise interval is preferably implemented by means of the Jarque-Bera test. This exploits the fact that the noise-signal components in the received signal are subject to a Gaussian distribution, while the spectral lines of the carriers and the intermodulation products in the received signal do not provide a Gaussian characteristic. If the Jarque-Bera test is applied to the sampled values of the modified received signal with second spectral lines removed, the Jarque-Bera test supplies a Jarque-Bera value, which is a measure for the Gaussian characteristic of the modified received signal. If this Jarque-Bera value is disposed above a selected threshold value, the modified received signal does not provide a pure Gaussian characteristic and accordingly, in addition to the purely Gaussian-distributed noise, also contains non-Gaussian spectral lines of carriers and intermodulation products.

Figure 1B:
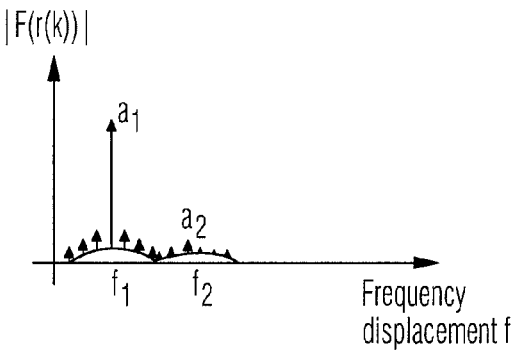
Figure 2A:
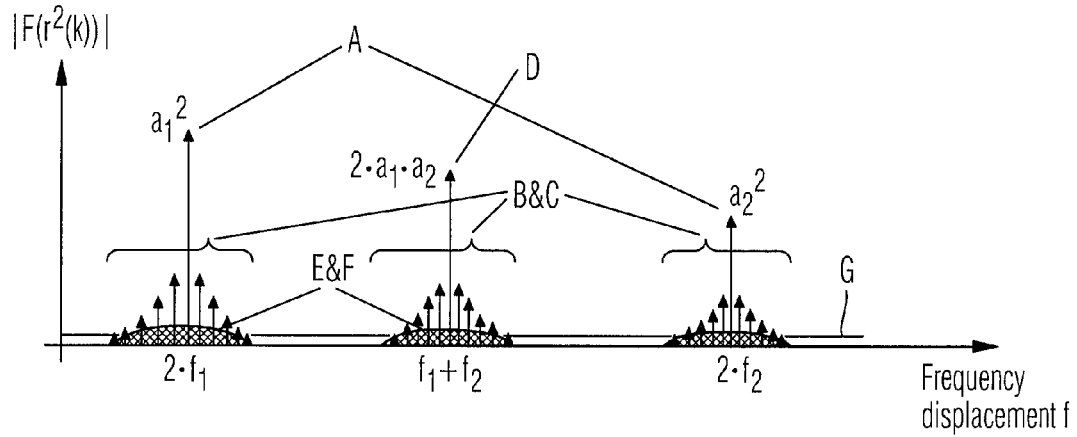
Figure 2B:
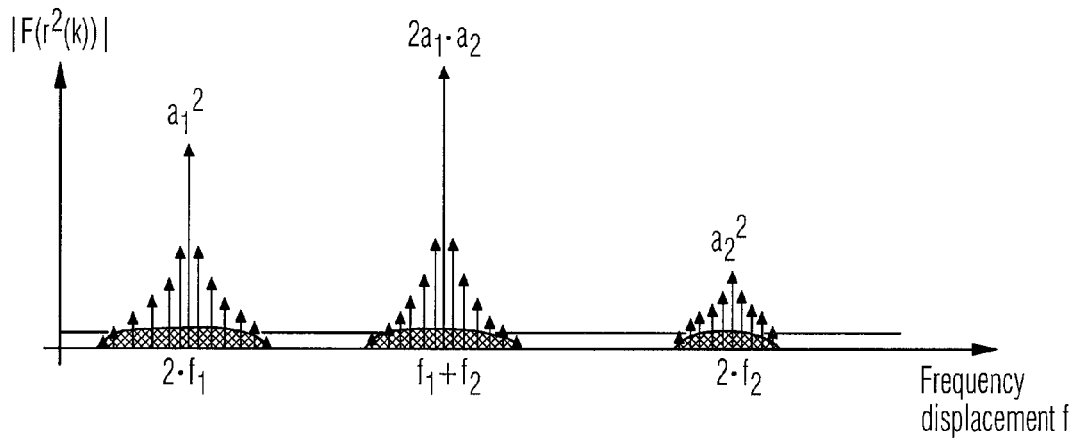
Figure 3A:
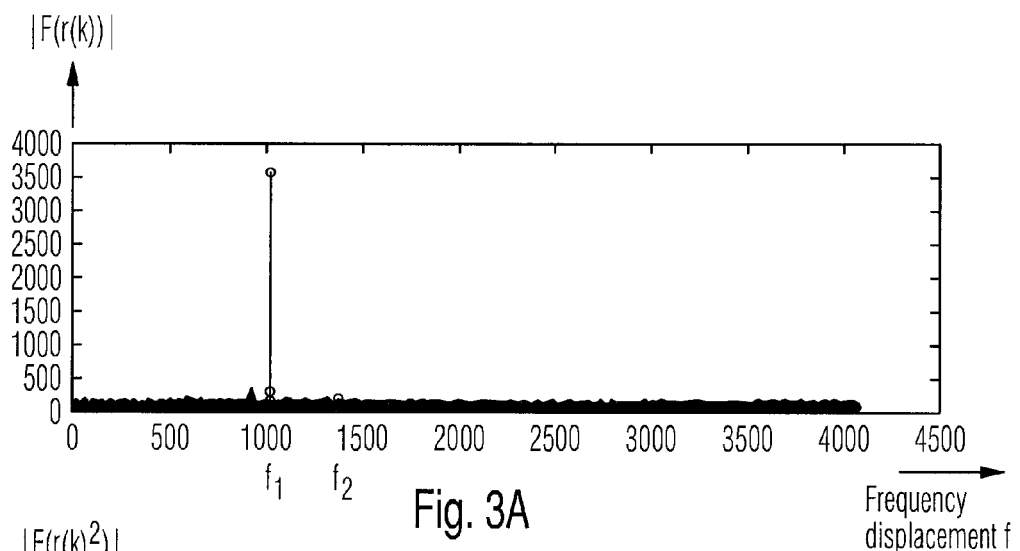
Figure 3B:
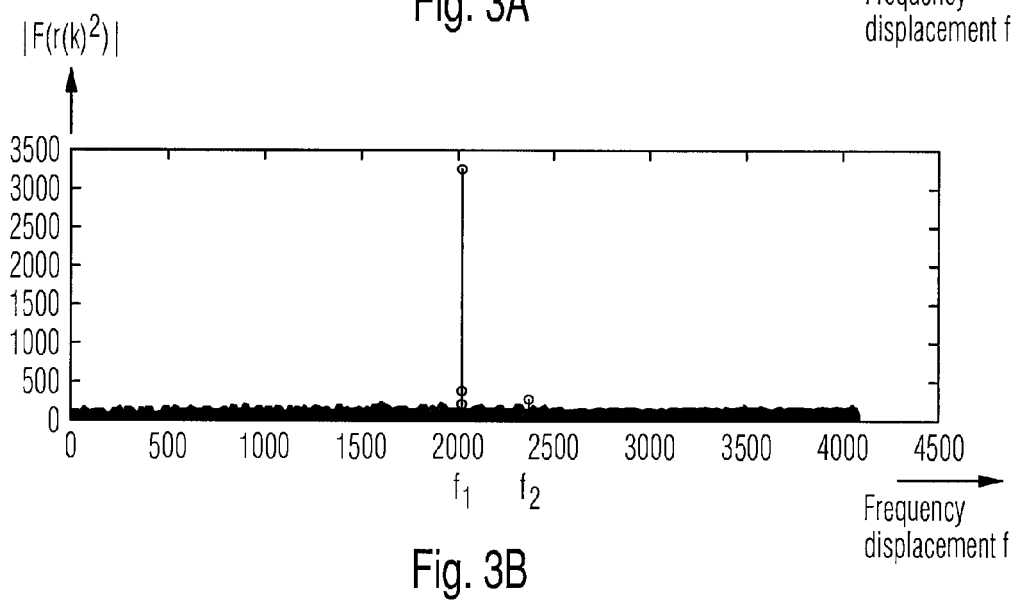
Figure 4:
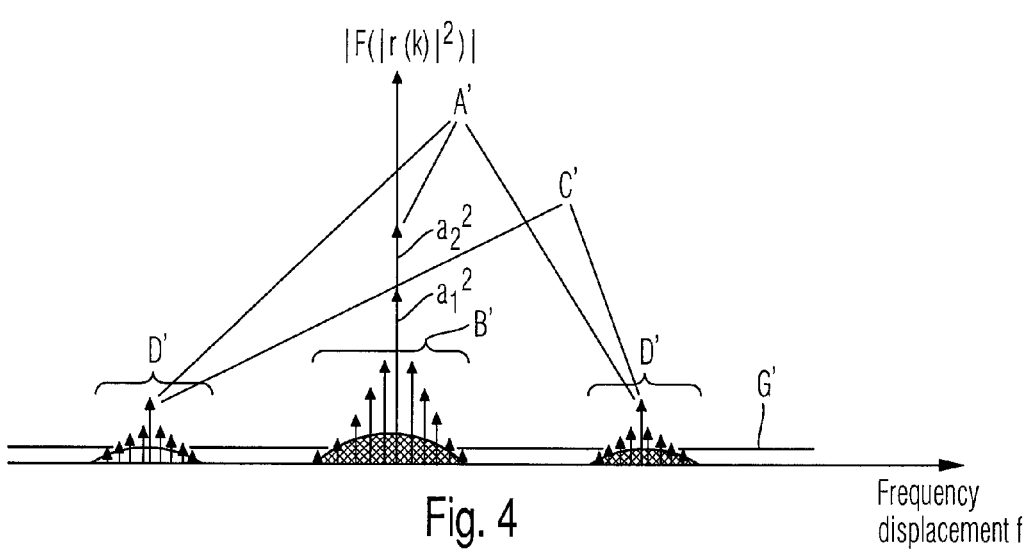
Figure 5:
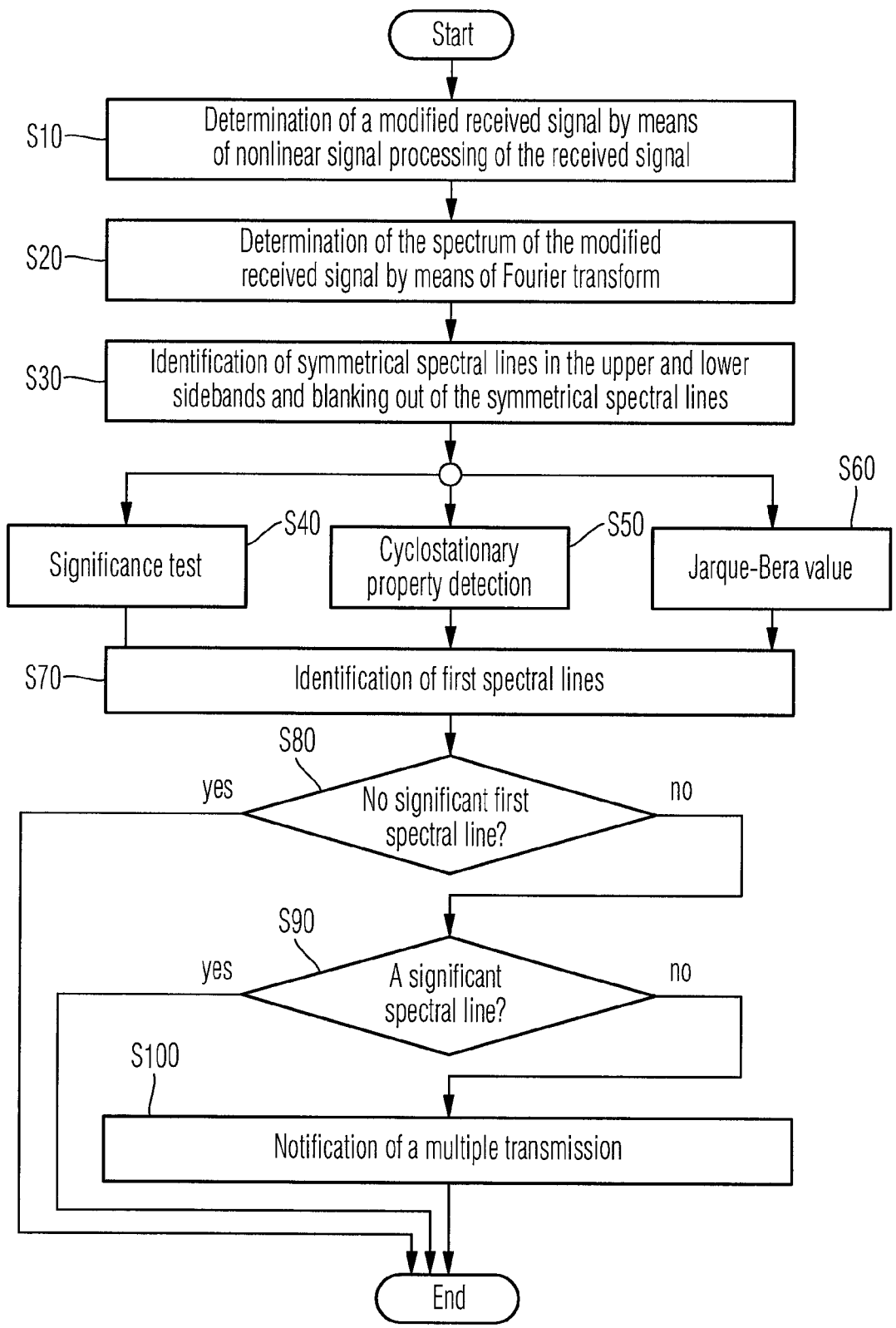
Figure 6:
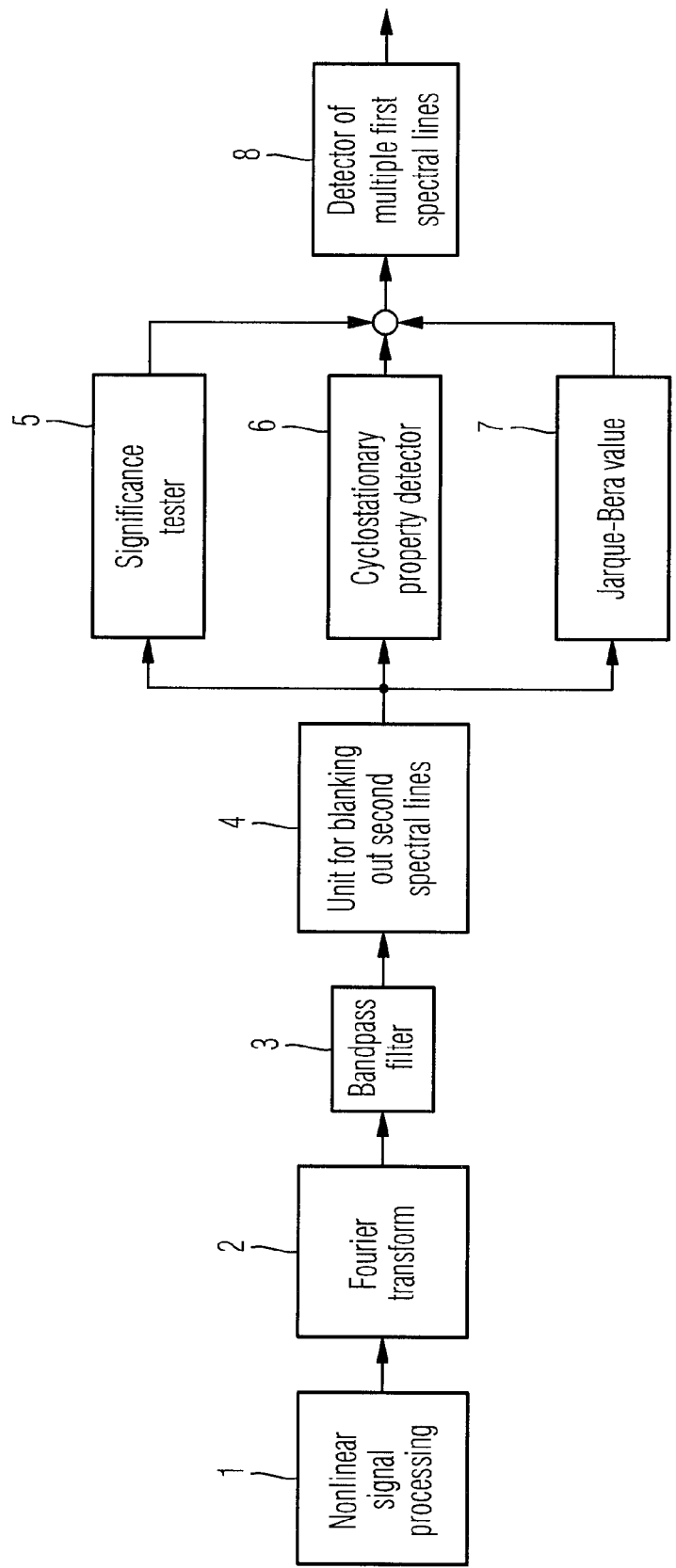

The method according to the invention and the device according to the invention are explained in greater detail below with reference to the drawings. The drawings are as follows:

FIGS. 1A, 1B a spectral display of the amplitude spectrum of a received signal containing two amplitude-modulated transmitted signals with a second transmitted signal with a large amplitude and with a small amplitude;

FIGS. 2A, 2B a spectral display of the amplitude spectrum of a received signal containing two amplitude-modulated transmitted signals with a second transmitted signal with a large amplitude and with a small amplitude, in a use according to the invention of a quadratic signal processing;

FIGS. 3A, 3B a spectral display of the amplitude spectrum of a received signal containing two amplitude-modulated transmitted signals with a second transmitted signal with small amplitude, with the use of a linear and a quadratic signal processing;

FIG. 4 a spectral display of the amplitude spectrum of a received signal containing two amplitude-modulated transmitted signals with a second transmitted signal with a large amplitude small amplitude, with a use according to the invention of a modulus function;

FIG. 5 a flow chart of an exemplary embodiment of the method according to the invention for detecting at least two amplitude-modulated transmitted signals with different frequency displacement contained in one received signal; and FIG. 6 a block-circuit diagram of an exemplary embodiment of a device according to the invention for detecting at least two amplitude-modulated transmitted signals contained in one received signal with different frequency displacement.

Before the method according to the invention and the device according to the invention are explained in detail with reference to FIGS. 5 and 6, the following section derives the mathematical bases required to understand the invention:

A sampled signal s(k) to be transmitted, which is amplitude-modulated with a degree of amplitude-modulation m and of which the carrier is additionally transmitted, experiences in the transmission channel an amplitude distortion a and phase distortion $\phi$ because of the lack of phase synchronisation between the oscillators of the respective aircraft and the ground station, and a frequency displacement f because of the Doppler effect of the aircraft moving with a different velocity and in a different direction and because of the lack of frequency synchronisation between the oscillators of the respective aircraft and the ground station. The amplitude distortion a, the phase distortion $\phi$ and the frequency displacement f are assumed to be approximately constant for the duration of the detection. The sampled signal s(k) to be transmitted and the superposed noise signal n(k) are set as unknown. The corresponding sampled received signal r(k) in the baseband is thus obtained according to equation (1). In this context $T_S$ is the sampling interval.

$$r(k) = r(t=k \cdot T_S) = (1+m \cdot s(k)) \cdot a \cdot e^{j\phi} \cdot e^{j2\pi f k T_S} + n(k) \quad k = \ldots, -2, -1, 0, 1, 2, \ldots \quad (1)$$

If transmitted signals are transmitted simultaneously in the same frequency channel by several transmitters, the sampled received signal r(k) with a total of U transmitters is obtained according to equation (2). The signal $s_u(k)$ to be transmitted by the transmitter u is amplitude-modulated with a degree of amplitude-modulation $m_u$ and experiences an amplitude distortion $a_u$, a phase distortion $\phi_u$ and a frequency displacement $f_u$.

$$r(k) = \sum_{u=1}^{U} (1 + m_u \cdot s_u(k)) \cdot a \cdot e^{j\varphi_u} \cdot e^{j2\pi f_u k T_S} + n(k) \quad k = \ldots, -2, -1, 0, 1, 2, \ldots \quad (2)$$

In the following section, the amplitude distortion $a_1$ in the transmission channel of the first transmitter is assumed according to equation (3) to be larger than the amplitude distortions $a_u$ in the transmission channels of the other transmitters.

$$a_1 > a_u \quad u = 2, 3, \ldots \quad (3)$$

The received signal r(k) containing a total of U transmitted signals according to equation (2) is subjected, according to equation (4), to squaring as a nonlinear signal processing function.

$$q_r(k) = r(k) \cdot r(k) = \left[ \sum_{u=1}^{U} (1 + m_u \cdot s_u(k)) \cdot a_u \cdot e^{j(2\pi f_u k T_S + \varphi_u)} + n(k) \right] \cdot \quad (4)$$

$$\left[ \sum_{v=1}^{V} (1 + m_v \cdot s_v(k)) \cdot a_v \cdot e^{j(2\pi f_v k T_S + \varphi_v)} + n(k) \right] =$$

$$\sum_{u=1}^{U} \sum_{v=1}^{V} (1 + m_u \cdot s_u(k)) \cdot (1 + m_v \cdot s_v(k)) \cdot a_u \cdot a_v \cdot e^{j(2\pi (f_u + f_v) k T_S + \varphi_u + \varphi_v)} +$$

$$\sum_{u=1}^{U} (1 + m_u \cdot s_u(k)) \cdot a_u \cdot e^{j2\pi f_u k T_S + \varphi_u} \cdot n(k) \cdot 2 + n(k)^2 =$$

$$\sum_{u=1}^{U} (1 + m_u \cdot s_u(k))^2 \cdot a_u^2 \cdot e^{j(2\pi (2 \cdot f_u) k T_S + 2 \cdot \varphi_u)} +$$

$$\sum_{\substack{u=1 \\ u \neq v}}^{U} \sum_{v=1}^{V} (1 + m_u \cdot s_u(k)) \cdot (1 + m_v \cdot s_v(k)) \cdot a_u \cdot a_v \cdot e^{j(2\pi (f_u + f_v) k T_S + \varphi_u + \varphi_v)} +$$

$$\sum_{u=1}^{U} (1 + m_u \cdot s_u(k)) \cdot a_u \cdot e^{j(2\pi f_u k T_S + \varphi_u)} \cdot 2 \cdot n(k) +$$

-continued $$n(k)^2 = \underbrace{\sum_{u=1}^{U} a_u^2 \cdot e^{j(2\pi (2 \cdot f_u) k T_S + 2 \cdot \varphi_u)}}_{A} +$$

$$\underbrace{\sum_{u=1}^{U} 2 \cdot m_u \cdot s_u(k) \cdot a_u^2 \cdot e^{j(2\pi (2 \cdot f_u) k T_S + 2 \cdot \varphi_u)}}_{B} +$$

$$\underbrace{\sum_{u=1}^{U} m_u^2 \cdot s_u(k)^2 \cdot e^{j(2\pi (2 \cdot f_u) k T_S + 2 \cdot \varphi_u)}}_{C} +$$

$$\underbrace{\sum_{\substack{u=1 \\ u \neq v}}^{U} \sum_{v=1}^{V} a_u \cdot a_v \cdot e^{j(2\pi (f_u + f_v) k T_S + \varphi_u + \varphi_v)}}_{D} +$$

$$\underbrace{\sum_{\substack{u=1 \\ u \neq v}}^{U} \sum_{v=1}^{V} (m_u \cdot s_u(k) + m_v \cdot s_v(k) + m_u \cdot s_u(k) \cdot m_v \cdot s_v(k)) \cdot a_u \cdot a_v \cdot e^{j(2\pi (f_u + f_v) k T_S + \varphi_u + \varphi_v)}}_{E} +$$

$$\underbrace{2 \cdot n(k) \cdot \sum_{u=1}^{U} (1 + m_u \cdot s_u(k)) \cdot a_u e^{j(2\pi f_u k T_S + \varphi_u)}}_{F} + \underbrace{n(k)^2}_{G}$$

After multiplying out all of the factors in equation (4), the following individual signal components are obtained:

According to equation (5), the first sum A in equation (4) contains all of the signal components of the carriers transmitted additionally in each of the individual transmitted signals, which each provide a periodicity with double the associated frequency displacement $2 \cdot f_u$ and are weighted with the squared factor of the amplitude distortion $a_u^2$. The associated spectrum of the first sum A contains respectively the spectral lines associated with the carriers at double the respectively associated frequency displacement $2 \cdot f_u$.

$$A = \sum_{u=1}^{U} a_u^2 \cdot e^{j(2\pi (2 \cdot f_u) k T_S + 2 \cdot \varphi_u)} \quad (5)$$

According to equation (6) the second sum B in equation (4) contains all of the signal components which are associated with the amplitude-modulated voice signals $m_u \cdot s_u(k)$ in the upper and lower sidebands and each provide a periodicity with double the associated frequency displacement $2 \cdot f_u$. The associated spectrum of the second sum B contains respectively the spectral lines associated with the amplitude-modulated voice signals in the upper and lower sideband symmetrical to the respectively associated, doubled frequency displacement $2 \cdot f_u$. The signal components associated with the amplitude-modulated voice signals $m_u \cdot s_u(k)$ in the time domain and the associated spectral lines in the frequency domain are each weighted by the squared factor of the amplitude distortion $a_u^2$.

$$B = \sum_{u=1}^{U} 2 \cdot m_u \cdot s_u(k) \cdot a_u^2 \cdot e^{j(2\pi (2 \cdot f_u) k T_S + 2 \cdot \varphi_u)} \quad (6)$$

According to equation (7), the third sum C in equation (4) contains all of the signal components which are associated with the distorted amplitude-modulated voice signals $m_u^2 \cdot s_u(k)^2$ in the upper and lower sidebands and provide respectively a periodicity with double the associated frequency displacement $2 \cdot f_u$. The associated spectrum of the third sum C contains respectively the spectral lines associated with the distorted amplitude-modulated voice signals $m_u^2 \cdot s_u(k)^2$ in the upper and lower sideband symmetrical to the respectively associated, doubled frequency displacement $2 \cdot f_u$. The signal components associated with the distorted amplitude-modulated voice signals $m_u^2 \cdot s_u(k)^2$ in the time domain and the associated spectral lines in the frequency domain are weighted respectively by the squared factor of the amplitude distortion $a_u^2$.

$$C = \sum_{u=1}^{U} m_u^2 \cdot s_u(k)^2 \cdot a_u^2 \cdot e^{j(2\pi(2 \cdot f_u)kT_S + 2 \cdot \varphi_u)} \quad (7)$$

According to equation (8), the fourth sum D in equation (4) contains all of the signal components of the carriers transmitted additionally in each case in the individual transmitted signals, which each provide a periodicity at the intermodulation frequencies of the associated frequency displacements $f_u + f_v$ are weighted with the multiplied factors of the associated amplitude distortions $a_u \cdot a_v$. The associated spectrum of the fourth sum D contains respectively the spectral lines associated with the intermodulation products from two carriers at the intermodulation frequencies of the associated frequency displacements $f_u + f_v$.

$$D = \sum_{\substack{u=1 \\ }}^{U} \sum_{\substack{v=1 \\ u \neq v}}^{V} a_u \cdot a_v \cdot e^{j(2\pi(f_u + f_v)kT_S + \varphi_u + \varphi_v)} \quad (8)$$

According to equation (9), the fifth sum E in equation (4) contains all of the signal components which are associated with the un-distorted amplitude-modulated voice signals $m_u \cdot s_u(k) + m_v \cdot s_v(k)$ and with the distorted amplitude-modulated voice signals $m_u \cdot m_v \cdot s_u(k) \cdot s_v(k)$ in the upper and lower sidebands and provide in each case a periodicity at the intermodulation frequencies of the associated frequency displacements $f_u + f_v$. The associated spectrum of the fifth sum E in each case contains the spectral lines associated with the un-distorted amplitude-modulated voice signals $m_u \cdot s_u(k) + m_v \cdot s_v(k)$ and the distorted amplitude-modulated voice signals $m_u \cdot m_v \cdot s_u(k) \cdot s_v(k)$ in the upper and lower sideband symmetrical to the respective intermodulation frequencies of the associated frequency displacements $f_u + f_v$. The signal components of the fifth sum E in the time domain and the associated spectral lines in the frequency domain are each weighted with the multiplied factors of the associated amplitude distortions $a_u \cdot a_v$.

$$E = \sum_{\substack{u=1 \\ }}^{U} \sum_{\substack{v=1 \\ u \neq v}}^{V} (m_u \cdot s_u(k) + m_v \cdot s_v(k) + m_u \cdot s_u(k) \cdot m_v \cdot s_v(k)) \cdot \quad (9)$$

$$a_u \cdot a_v \cdot e^{j(2\pi(f_u + f_v)kT_S + \varphi_u + \varphi_v)}$$

According to equation (10), the sixth sum F in equation (4) contains all of the signal components which are associated with all amplitude-modulated voice signals $m_u \cdot s_u(k)$ superposed with the noise signal $n(k)$ and with the carriers additionally transmitted in the respective transmission channel and also superposed with the noise signal $n(k)$ and provide a periodicity with the associated frequency displacement $f_u$. These signal components are weighted with the factor of the associated amplitude distortion $a_u$ and represent un-correlated signal components because of the lack of correlation with the stochastic noise signal $n(k)$. The associated spectrum of the sixth sum F contains respectively un-correlated spectral components in the upper and lower sideband symmetrical to the associated frequency displacement $f_u$.

$$F = 2 \cdot n(k) \cdot \sum_{u=1}^{U} (1 + m_u \cdot s_u(k)) \cdot a_u \cdot e^{j(2\pi f_u kT_S + \varphi_u)} \quad (10)$$

According to equation (11), the seventh term G in equation (4) contains the squared, un-correlated noise signal $n(k)$. The associated spectrum of the seventh term G contains un-correlated spectral components.

$$G = n(k)^2 \quad (11)$$

With two transmitters, the spectral components associated respectively with the individual sums A to F and with the term G are displayed in the amplitude spectrum of the modified received signal of FIG. 2A for the case of a second transmitter with a comparatively high amplitude $a_2$, and in the amplitude spectrum of the modified received signal of FIG. 2B for the case of a second transmitter with a comparatively lower amplitude $a_2$ with the use of a quadratic signal processing. In FIGS. 3A and 3B, amplitude spectra of a received signal or respectively modified received signal are compared with a second transmitted signal with comparatively lower amplitude $a_2$ with the use of a linear signal processing and respectively with a quadratic signal processing.

If the received signal $r(k)$ containing a total of U transmitted signals according to equation (2) is subjected to a modulus function as a nonlinear signal processing function, according to equation (12), the following signal components are obtained after multiplying out the individual factors:

$$p_r(k) = r(k) \cdot r(k) = \left[\sum_{u=1}^{U} (1 + m_u \cdot s_u(k)) \cdot a_u \cdot e^{j(2\pi f_u kT_S + \varphi_u)} + n(k)\right] \cdot \quad (12)$$

$$\left[\sum_{v=1}^{V} (1 + m_v \cdot s_v(k)) \cdot a_v \cdot e^{j(2\pi f_{uv} kT_S + \varphi_v)} + n(k)\right] =$$

$$\sum_{u=1}^{U} \sum_{v=1}^{V} (1 + m_u \cdot s_u(k)) \cdot (1 + m_v \cdot s_v(k)) \cdot$$

$$a_u \cdot a_v \cdot e^{j(2\pi(f_u + f_v)kT_S + \varphi_u + \varphi_v)} +$$

$$\sum_{u=1}^{U} (1 + m_u \cdot s_u(k)) \cdot a_u \cdot e^{j(2\pi f_u kT_S + \varphi_u)} \cdot n(k) \cdot 2 + n(k)^2 =$$

$$\sum_{u=1}^{U} (1 + m_u \cdot s_u(k))^2 \cdot a_u^2 \cdot e^{j(2\pi(2 \cdot f_u)kT_S + 2 \cdot \varphi_u)} +$$

-continued $$\sum_{u=1}^{U}\sum_{\substack{v=1\\u\neq v}}^{V}(1+m_u\cdot s_u(k))\cdot(1+m_v\cdot s_v(k))\cdot$$

$$a_u\cdot a_v\cdot e^{j(2\pi(f_u+f_v)kT_S+\varphi_u+\varphi_v)}+$$

$$\sum_{u=1}^{U}(1+m_u\cdot s_u(k))\cdot a_u\cdot e^{j(2\pi f_u kT_S+\varphi_u)}\cdot n(k)^*+$$

$$\sum_{v=1}^{V}(1+m_v\cdot s_v(k))\cdot a_v\cdot e^{j(2\pi f_v kT_S+\varphi_v)}\cdot n(k)+|n(k)|^2=$$

$$\underbrace{\sum_{u=1}^{U}a_u^2}_{A'}+\underbrace{\sum_{u=1}^{U}m_u^2\cdot s_u(k)^2\cdot a_u^2}_{B'}+\cdot$$

$$\underbrace{\sum_{u=1}^{U}\sum_{\substack{v=1\\u\neq v}}^{V}a_u\cdot a_v\cdot e^{j(2\pi(f_u+f_v)kT_S+\varphi_u+\varphi_v)}}_{C'}+$$

$$\underbrace{\sum_{u=1}^{U}\sum_{\substack{v=1\\u\neq v}}^{V}(m_u\cdot s_u(k)+m_v\cdot s_v(k)+m_u\cdot s_u(k)\cdot m_v\cdot s_v(k))\cdot}_{}$$

$$\underbrace{a_u\cdot a_v\cdot e^{j(2\pi(f_u+f_v)kT_S+\varphi_u+\varphi_v)}}_{D'}+$$

$$\underbrace{\sum_{u=1}^{U}(1+m_u\cdot s_u(k))\cdot a_u e^{j(2\pi f_u kT_S+\varphi_u)}\cdot n(k)^*}_{E'}+$$

$$\underbrace{\sum_{v=1}^{V}(1+m_v\cdot s_v(k))\cdot a_v\cdot e^{j(2\pi f_v kT_S+\varphi_v)}\cdot n(k)}_{F'}+\underbrace{|n(k)|^2}_{G'}$$

According to equation (13), the first sum A' in equation (12) contains all of the signal components of the respectively additionally transmitted carriers in the individual transmitted signals, which are each weighted with the squared factor of the amplitude distortion $a_u^2$ and represent pure direct signal components.

$$A'=\sum_{u=1}^{U}a_u^2 \quad (13)$$

According to equation (14), the second sum B' in equation (12) contains all of the signal components which are associated with the distorted amplitude-modulated voice signals $m_u^2\cdot s_u(k)^2$ in the upper and lower sidebands and in each case represent direct signal components. The associated spectrum of the second sum B' contains respectively the spectral lines associated with the distorted amplitude-modulated speech signals in the upper and lower sideband symmetrical to the zero frequency. The signal components associated with the distorted amplitude-modulated voice signals $m_u^2\cdot s_u(k)^2$ in the time domain and the associated spectral lines in the frequency domain are weighted in each case by the squared factor of the amplitude distortion $a_u^2$.

$$B'=\sum_{u=1}^{U}m_u^2\cdot s_u(k)^2\cdot a_u^2 \quad (14)$$

According to equation (15), the third sum C' in equation (12) contains all of the signal components of the respectively additionally transmitted carriers in the individual transmitted signals, which each provide a periodicity at the intermodulation frequencies of the associated frequency displacements $f_u-f_v$ and respectively $f_v-f_u$ and are weighted with the multiplied factors of the associated amplitude distortions $a_u\cdot a_v$. In each case, the associated spectrum of the third sum C' contains the spectral lines associated with the intermodulation products of two carriers at the intermodulation frequencies of the associated frequency displacements $f_u-f_v$ and respectively $f_v-f_u$.

$$C'=\sum_{u=1}^{U}\sum_{\substack{v=1\\u\neq v}}^{V}a_u\cdot a_v\cdot e^{j(2\pi(f_u-f_v)kT_S+\varphi_u-\varphi_v)} \quad (15)$$

According to equation (16), the fourth sum D' in equation (12) contains all of the signal components which are associated with the un-distorted amplitude-modulated voice signals $m_u\cdot s_u(k)+m_v\cdot s_v(k)$ and with the distorted amplitude-modulated voice signals $m_u\cdot m_v\cdot s_u(k)\cdot s_v(k)$ in the upper and lower sidebands and each provide a periodicity at the intermodulation frequencies of the associated frequency displacements $f_u-f_v$ and respectively $f_v-f_u$. In each case, the associated spectrum of the fourth sum D' contains the spectral lines associated with the un-distorted amplitude-modulated voice signals $m_u\cdot s_u(k)+m_v\cdot s_v(k)$ and with the distorted amplitude-modulated voice signals $m_u\cdot m_v\cdot s_u(k)\cdot s_v(k)$ in the upper and lower sideband symmetrical to the respective intermodulation frequencies of the associated frequency displacements $f_u-f_v$ and respectively $f_v-f_u$. The signal components of the fourth sum D' in the time domain and the associated spectral lines in the frequency domain are each weighted with the multiplied factors of the associated amplitude distortions $a_u\cdot a_v$.

$$D'=\sum_{u=1}^{U}\sum_{\substack{v=1\\u\neq v}}^{V}(m_u\cdot s_u(k)+m_v\cdot s_v(k)+m_u\cdot s_u(k)\cdot m_v\cdot s_v(k))\cdot \quad (16)$$

$$a_u\cdot a_v\cdot e^{j(2\pi(f_u-f_v)kT_S+\varphi_u-\varphi_v)}$$

According to equation (17), the seventh term H' in equation (12) contains the modulus squared $|n(k)|^2$ of the uncorrelated noise signal.

$$G'=|n(k)|^2 \quad (17)$$

The fifth sum E' in equation (12) with the carriers transmitted additionally in the individual transmitted signals and the individual amplitude-modulated voice signals $m_u\cdot s_u(k)$, which each provide a periodicity with the associated frequency displacement $f_u$ and are weighted with the factor of the associated amplitude distortion $a_u$, and the sixth sum F' in equation (12) with the carriers additionally transmitted in the individual transmitted signals and the individual amplitude-modulated voice signals $m_u\cdot s_u(k)$, which each provide a periodicity at the associated negative frequency displacement $-f_v$ and are weighted with the factor of the associated amplitude distortion $a_v$, are blanked out for the further analysis by a bandpass filter with a central frequency at the zero frequency.

In the case of two transmitters, the spectral components associated respectively with the individual sums A' to D' and with the term H' are displayed in the amplitude spectrum of the modified received signal of FIG. 4 with a second transmitted signal with a comparatively low amplitude $a_2$.

Alongside these second-order nonlinearities, nonlinearities of a higher order can naturally also be used. The mathematical derivation of the signal components of the received signal occurring with higher-order nonlinear signal processing will not be provided at this point. In principle, the number of spectral lines respectively associated with the carrier signals and the periodic signal components of the voice signal increases with the order of the nonlinearity. Accordingly, the signal-processing costs for the detection of at least two transmitted signals contained in the received signal also rises significantly with the use of a higher-order nonlinearity as a result of the plurality of spectral lines to be analysed and is therefore less suitable for use in practice.

In order to obtain unambiguous detection criteria for the identification of at least two transmitted signals in the received signal, the spectral lines of the carrier signals and of the intermodulation products substantial for the detection must be separated from the plurality of spectral lines and from the plurality of un-correlated spectral components which occur in the case of nonlinear signal processing.

In a first step, the spectral lines associated with the voice-signal components are blanked out from the spectrum of the received signal processed with a nonlinearity. Knowledge of the effect of the nonlinearity on the spectral lines of the voice signals is of substantial importance for a successful blanking out of the spectral lines associated with the voice-signal components. For this purpose, starting from the received signal in the baseband according to equation (1), the high-frequency received signal is considered in order to implement the nonlinear signal processing. According to equation (18), by contrast with the received signal in the baseband, the high-frequency received signal is modulated on a carrier with the carrier frequency $f_c$ and the carrier phase $\phi_c$ and amplified by the real amplification factor P of the transmission amplifier.

$$r_{HF}(t) = P \cdot (1 + m \cdot s(t)) \cdot \cos(2\pi f_c t + \phi_c) \tag{18}$$

The high-frequency received signal $r_{HF}(t)$ according to equation (18) is therefore a real time-signal, which provides an even amplitude spectrum and an odd phase spectrum. A signal of this kind is therefore conjugated-symmetrical relative to the zero frequency. The upper and lower sideband of the high-frequency received signal $r_{HF}(t)$ conjugated-symmetrical carrier frequency $f_c$.

If this high-frequency received signal $r_{HF}(t)$ according to equation (18) is supplied to a nonlinearity, the modified high-frequency received signal $r_{HF}(t)'$ is obtained according to equation (19).

$$r_{HF}(t)' = F\{P \cdot (1 + m \cdot s(t)) \cdot \cos(2\pi f_c t + \phi_c)\} \tag{19}$$

Since the argument of the nonlinearity function $F\{\cdot\}$ is a periodic function with the carrier frequency $f_c$ as the periodicity, the result of the nonlinear function $F\{\cdot\}$ according to equation (20) is a periodic function, which can be displayed as a Fourier sequence with harmonics respectively dependent upon the carrier frequency $f_c$ and upon multiples of the carrier frequency $f_c$ and with the Fourier coefficients $\alpha_k$ and $\beta_k$ according to equation (21) and (22).

$$r_{HF}(t)' = \sum_{k=1}^{\infty} \alpha_k \cdot \cos(k \cdot \alpha) + \beta_k \cdot \sin(k \cdot \alpha) \text{ with } \alpha = 2\pi f_c t + \varphi_c \tag{20}$$

$$\alpha_k = \frac{1}{\pi} \int_0^{2\pi} F\{A(t) \cdot \cos\alpha\} \cdot \cos(k \cdot \alpha) d\alpha \text{ with } A(t) = P \cdot (1 + m \cdot s(t)) \tag{21}$$

$$\beta_k = \frac{1}{\pi} \int_0^{2\pi} F\{A(t) \cdot \cos\alpha\} \cdot \sin(k \cdot \alpha) d\alpha \tag{22}$$

If the result of the nonlinear function $F\{\cdot\}$ is approximated only through the first harmonic, equations (20) to (22) are substituted into equations (23) to (25).

$$r_{HF}(t)' = f_1(A(t)) \cdot \cos(2\pi f_c t + \phi_c) + f_2(A(t)) \cdot \sin(2\pi f_c t + \phi_c) \tag{23}$$

$$f_1(A(t)) = \alpha_1 = \frac{1}{\pi} \int_0^{2\pi} F\{A(t) \cdot \cos\alpha\} \cdot \alpha \, d\alpha \tag{24}$$

$$f_2(A(t)) = \beta_1 = \frac{1}{\pi} \int_0^{2\pi} F\{A(t) \cdot \cos\alpha\} \cdot \sin\alpha \, d\alpha \tag{25}$$

The two Fourier coefficients $f_1(A(t))$ and $f_2(A(t))$ according to equation (24) and (25) represent the real part and the imaginary part of the complex number $f_1(A(t)) + j \cdot f_2(A(t))$. Accordingly, the result of the nonlinear function $F\{\cdot\}$ according to equation (23) can be transferred to equation (26), which takes into consideration the amplitude transmission behaviour $f(A(t))$—the so-called AM-AM characteristic—of the nonlinearity $F\{\cdot\}$ according to equation (27) and the amplitude-phase transmission behaviour $g(A(t))$—the so-called AM-PM characteristic—of the nonlinearity $F\{\cdot\}$ according to equation (28).

$$r_{HF}(t)' = f(A(t)) \cdot \cos(2\pi f_c t + \phi_c + g(A(t))) \tag{26}$$

$$f(A(t)) = \sqrt{f_1(A(t))^2 + f_2(A(t))^2} \tag{27}$$

$$g(A(t)) = \arctan\left(\frac{f_2(A(t))}{f_1(A(t))}\right) \tag{28}$$

The high-frequency received signal $r_{HF}(t)'$ modified by the nonlinearity according to equation (26) remains real, so that the associated spectrum is conjugated-symmetrical relative to the zero frequency. The spectral lines and un-correlated spectral components of the voice signal $m \cdot s(t)$ in the upper and lower sidebands are amplitude-distorted because of the AM-AM characteristic of the nonlinearity. However, the amplitudes of the spectral lines and the un-correlated spectral components of the voice signal $m \cdot s(t)$ in the upper and lower sidebands provide an even symmetry with regard to the carrier frequency. Moreover, the phases of the spectral lines and the un-correlated spectral components of the voice signal $m \cdot s(t)$ lose their odd symmetry with regard to the carrier frequency because of the AM-PM characteristic of the nonlinearity. They therefore are no longer exactly conjugated-symmetrical relative to the carrier frequency. However, they continue to be frequency-symmetrical relative to the carrier frequency.

Accordingly, the pairs of spectral lines of the voice signal arranged symmetrically in the respectively upper and lower sideband of the individual carriers cannot be identified on the basis of their amplitude and phase, but only on the basis of their identical frequency interval relative to the frequency of the respective carrier. The pair of spectral lines at the frequencies $f_{lSp}$ and $f_{rSp}$ each provide a frequency interval $f_{lSp}-f_{Tr}$ and $f_{rSp}-f_{Tr}$ relative to the frequency $f_{Tr}$ of the respective carrier, which are never exactly identical. In order to identify a pair of spectral lines of the voice signal positioned symmetrically relative to the carrier, the difference between the two frequency intervals is compared with a first threshold value $SW_1$ according to equation (29).

If the difference between the two frequency intervals is less than the first threshold value $SW_1$ a pair of spectral lines of the voice signal positioned symmetrically relative to the carrier, which can be blanked out from the spectrum, is present.

$$(f_{lSp}-f_{Tr})-(f_{rSp}-f_{Tr})<SW1 \quad (29)$$

If the individual pairs of spectral lines arranged symmetrically relative to the spectral lines of the carriers and/or the intermodulation products—the so-called second spectral lines—are completely blanked out from the spectrum of the nonlinear modified received signal under consideration, the spectral lines of the carrier and/or of the intermodulation products positioned asymmetrically—the so-called first spectral lines—can be selected unambiguously from the un-correlated spectral components of the voice signal and from the legal noise floor.

If a comparatively large signal-noise interval is present, and accordingly, first spectral lines differ significantly from the un-correlated spectral components of the voice signal and the legal noise floor, a first spectral line can be detected using a significance test if the amplitude $\hat{x}_1$ of the first spectral line according to equation (30) is higher than a second threshold value $SW_2$ used as a significance level above the mean value $E\{x_i\}$ of all sampled values $x_i$ of the spectrum of the modified received signal with the second spectral lines removed.

$$\hat{x}_1 > SW_2 + E\{x_i\} \quad (30)$$

In the case of first spectral lines which do not project significantly from the noise floor and the un-correlated spectral components of the voice signal, the cyclostationary property detection can be used. With regard to the mathematical basis of the cyclostationary property detection, reference is made to equations (1) to (9) in US 2010/0054352 A1.

The Jarque-Bera test, which is applicable additionally or as an alternative in the case of first spectral lines not projecting significantly above the noise floor and the un-correlated spectral components of the voice signal, calculates, from a total of n sampled values of the spectrum of the nonlinear modified received signal with the second spectral lines removed, a Jarque-Bera value JB according to equation (31), which contains the skew S according to equation (32) and the kurtosis K according to equation (33). The value $\bar{x}$ occurring in this context represents the mean value of all n sampled values. The Jarque-Bera value JB is compared with a third threshold value $SW_3$. If the Jarque-Bera value is disposed above the third threshold value $SW_3$, a first spectral line exists in the spectrum of the modified received signal.

For relatively high values of the third threshold value $SW_3$, several first spectral lines can be identified in the spectrum of the modified received signal. The respective values of the third threshold value $SW_3$ must be determined by simulation.

$$JB = \frac{n}{6} \cdot \left( S^2 + \frac{(K-3)^2}{4} \right) > SW_3 \quad (31)$$

$$S = \frac{\frac{1}{n} \cdot \sum_{i=0}^{n-1} (x_i - \bar{x})^3}{\left( \frac{1}{n} \cdot \sum_{i=0}^{n-1} (x_i - \bar{x})^2 \right)^{\frac{3}{2}}} \quad (32)$$

$$K = \frac{\frac{1}{n} \cdot \sum_{i=0}^{n-1} (x_i - \bar{x})^4}{\left( \frac{1}{n} \cdot \sum_{i=0}^{n-1} (x_i - \bar{x})^2 \right)^{2}} \quad (33)$$

In the following section, the method according to the invention for detecting at least two amplitude-modulated transmitted signals contained in one received signal with different frequency displacement is explained with reference to the flow chart in FIG. 5, and the associated device according to the invention for detecting at least two amplitude-modulated transmitted signals contained in one received signal with different frequency displacement is explained in detail on the basis of the block-circuit diagram in FIG. 6:

In the first method step S10, after mixing into the baseband, the received signal is subjected to a nonlinear signal-processing function in a nonlinear signal-processing unit 1. By preference, a quadratic signal-processing function is used in this context, because this is the simplest to realise and generates a spectrum of the modified received signal generated by the nonlinear signal-processing function which provides only second-order spectral lines and associated upper and lower sidebands.

In the next method step S20, the spectrum of the modified received signal is determined in the Fourier transformer 2 by means of Fourier transform. Instead of a Fourier transform with subsequent detection of spectral lines, the so-called Multiple Signal Classification (MUSIC) algorithm or the so-called Estimation of Signal Parameters via Rotational Invariance Techniques (ESPRIT) algorithm can also be used, both of which are based on the analysis of Eigen values of covariance matrices.

In the next method step S30, the spectrum of the modified received signal is restricted by means of a bandpass filter 3 to the frequency range relevant for the further analysis. This restriction of the frequency range to be analysed is dependent upon the nonlinearity used.

If a quadratic nonlinearity is used, the bandpass filter 3 covers the frequency range in which the harmonics and the second-order intermodulation products of the carrier signals for the transmitted signals contained in the modified received signals and the associated upper and lower sidebands of the voice-signal components are positioned.

With the use of a modulus function as the nonlinearity, the bandpass filter 3 covers the frequency range which is symmetrical to the zero frequency and contains the direct signal components and first-order intermodulation products of the carrier signals for the transmitted signals contained in the modified received signal and the associated upper and lower sidebands of the voice-signal components.

With the use of a higher-order nonlinearity—for example, a cubic signal-processing function—the bandpass filter 3 covers the frequency range in which the harmonics and the intermodulation products of the respectively highest order of the carrier signals for the transmitted signals contained in the modified received signal and the associated upper and lower side edges of the voice-signal components are positioned.

In the next method step S40, in a unit for blanking out second spectral lines 4 in the band-restricted spectrum of the modified received signal, the spectral lines of the associated voice-signal components arranged symmetrically in the associated upper and lower sidebands relative to the asymmetrically positioned spectral lines of the harmonics and the intermodulation products of the individual carrier signals are identified and then blanked out from the band-restricted spectrum of the modified received signal.

These second spectral lines, which are to be blanked out, are identified by identifying the spectral line with the highest amplitude as an asymmetrically positioned, first spectral line and marking it as such, and, with regard to the spectral line with the next smallest amplitude, by then seeking a further spectral line, of which the frequency-displacement intervals differ, in each case maximally, according to equation (29), from the frequency displacement of the spectral line with the highest amplitude by an appropriately selected first threshold value $SW_1$, and accordingly provide approximately identical frequency-displacement intervals relative to the frequency displacement of the spectral line with the highest amplitude.

The pair of symmetrical, second spectral lines identified in this manner is then blanked out from the band-restricted spectrum of the modified received signal. Following this, further pairs of second spectral lines, which are symmetrical with regard to their frequency displacement to the frequency displacement of the spectral lines with the highest amplitude, are sought by selecting the next smallest spectral line from the remaining spectral lines and seeking a further spectral line, for which the identity condition in the frequency-displacement intervals according to equation (29) applies.

As soon as all spectral lines have been investigated for the presence of a pair of spectral lines symmetrical with regard to the spectral line with the highest amplitude, the spectral line with the currently largest amplitude is sought among all of the spectral lines remaining within the restricted spectrum of the modified received signal and not yet marked as first spectral lines and marked accordingly as an asymmetrical first spectral line. The remaining spectral lines are investigated with regard to the existence of pairs of second spectral lines symmetrical with regard to these current, asymmetrical, first spectral lines. This process is implemented until all of the spectral lines present in the restricted spectrum of the modified received signal have either been marked as asymmetrical, first spectral lines or blanked out as symmetrical, second spectral lines.

In this manner, all distorted and/or un-distorted periodic voice-signal components of every transmitted signal contained in the modified received signal are removed from the restricted spectrum of the modified received signal.

In order to separate the asymmetrical, first spectral lines from the un-correlated voice-signal components still contained in the restricted spectrum of the modified received signal of the transmitted signals contained in a modified received signal and from the superposed noise floor, additional statistical tests are implemented, in the following three method steps S40, S50 and S60, within the restricted spectrum of the modified received signal. These statistical tests can be implemented either overall or only in individual cases. In the case of a low signal-noise interval, in which the individual spectral lines typically do not project significantly above the spectral components of the un-correlated voice signals and the noise floor, only a cyclostationary property detection is required in method step S50 and/or a Jarque-Bera test in method step S60.

With a relatively higher signal-noise interval, a significance test can be implemented additionally or alternatively in method step S40.

In the case of the significance test in method step S40, the asymmetrical first spectral lines marked in the restricted spectrum of the modified received signal are compared in a significance tester 5 with a significance level $SW_2$ according to equation (30) disposed above the mean value $E\{\cdot\}$ of the remaining sampled values of the restricted spectrum. This second threshold value $SW_2$ of the significance level is a freely selectable value which can be determined, for example, by simulation. If the respective asymmetrical, first spectral line with the amplitude above the significance level is disposed above the mean value $E\{\cdot\}$ of the remaining sampled values of the restricted spectrum, a first spectral line associated with a carrier signal of a transmitted signal contained in the modified received signal has been significantly detected. The detected, first spectral line associated with a carrier signal is positioned, dependent upon the nonlinearity used, at the zero frequency, at a multiple of the carrier frequency and/or at one of the intermodulation frequencies.

In the case of the cyclostationary property detection in method step S50, the periodic signal components of the modified received signal are separated, in a cyclostationary property detector 6, from all non-periodic signal components of the modified received signal. In this manner, all of the first spectral lines contained in the modified received signal are determined together with their respective frequencies. As an alternative which is also covered by the invention, the cyclostationary property detection can also be implemented in method step S30, before the determination of the second spectral lines contained in the spectrum of the modified received signal. In this case, first spectral lines and also second spectral lines are detected by the cyclostationary property detection together with their associated frequencies.

In the case of the Jarque-Bera test in method step S60, the Jarque-Bera value JB for the modified received signal with second spectral lines removed, which determines the extent of the Gaussian component in the signal under investigation, is determined according to equations (31) to (33) in a Jarque-Bera tester 7. The proportion of spectral lines which do not provide a Gaussian characteristic and the proportion of noise-determined spectral lines in the signal under investigation, which typically satisfy a Gaussian distribution, can be determined in this manner. By comparing the Jarque-Bera value JB determined with a third threshold value $SW_3$, it is possible to investigate whether a given proportion of spectral lines is present in the signal under investigation. Accordingly, by selecting the third threshold value $SW_3$, it is possible to determine whether a first spectral line or two or more first spectral lines are present in the modified received signal with second spectral lines removed. The Jarque-Bera test can also be implemented in method step S30 before the determination of the second spectral lines contained in the spectrum of the modified received signal. This is also covered by the invention. In this case, first spectral lines and also second spectral lines in the modified received signal can be detected by the Jarque-Bera test.

In the next method step S70, all of the first spectral lines detected in the preceding statistical tests together with their amplitudes, frequencies and phases are combined within a detector of multiple first spectral lines 8. In the same detector of multiple first spectral lines 8, it is determined, in the next method step S80, whether no first spectral lines at all are present in the spectrum of the modified received signal with second spectral lines removed, and accordingly, only one received signal with a noise floor is present. If this is not the case, in the next method step S90, in the same detector of multiple first spectral lines 8, it is determined whether a single first spectral line is present in the spectrum of the modified received signal with the second spectral lines removed, and accordingly, only a single transmitted signal transmitted from a single transmitter is present in the received signal, or whether several first spectral lines—typically three spectral lines per transmitted signal—are present in the spectrum of the modified received signal with second spectral lines removed, and accordingly, several transmitted signals transmitted respectively by one transmitter are present at the same time in the received signal in the same reception channel.

In the final method step S100, if several first spectral lines have been identified in the modified received signal, and accordingly, several transmitted signals each transmitted by a transmitter are present in the received signal, the pilots in the individual aircraft and the personnel in the ground station are notified of the simultaneous transmission of several transmitted signals in the same frequency channel.

In the simplest variant for preventing a false alarm in the notification of several transmitted signals contained in one received signal, the number of sampled values of the received signal is increased. In this context, the input blocks of sampled values of the nonlinear modified received signal for the implementation of the Fourier transform can be overlapping or non-overlapping.

A further option for preventing false alarms is to combine the results of the individual statistical tests via a decision rule. A decision rule could, for example, be that several transmitted signals are contained in the modified received signal, if this has been determined simultaneously by at least two statistical tests—the significance test, the cyclostationary property detection and the Jarque-Bera test. A further exemplary decision rule for the presence of several transmitted signals in the modified received signal would be present, if the cyclostationary property direction and the Jarque-Bera test were to detect this several times in succession.

A third variant for preventing false alarms is provided by determining the mean value of the first spectral lines detected respectively in several cycles and comparing the averaged first spectral lines with the averaged noise floor and/or the averaged remaining spectral lines, that is, the averaged second spectral lines. The advantage of this variant is a reduction in the probability for a false alarm at the same time as an increase in the probability of detection.

The invention is not restricted to the embodiment illustrated. In particular, all combinations of all of the features claimed in the claims, all of the features disclosed in the description and all of the features illustrated in the drawings are also covered by the invention. The method has in fact been described above with the example of amplitude modulation, but is not restricted to this.

The invention claimed is:

1. A method for detecting at least two transmitted signals contained in a received signal within a same frequency channel with respectively different frequency displacements, comprising:
    determining a modified received signal by using nonlinear signal processing of the received signal;
    determining a spectrum of the modified received signal by using a Fourier transform; and
    detecting at least two transmitted signals contained in the received signal if at least two first spectral lines each associated with carrier signals are distinguishable within the determined spectrum from spectral components associated with noise signals and payload signals,
    wherein the at least two transmitted signals contained in the received signal are detected if the at least two first spectral lines of carrier signals contained in the modified received signal are identified within the determined spectrum, of which amplitudes are respectively a multiple of the mean value of an amplitude of the spectral components of the noise signals and payload signals contained in the modified received signal.

2. The method according to claim 1, wherein the identified first spectral lines of the carrier signals are direct signal components, harmonics, and/or intermodulation products.

3. The method according to claim 1, wherein second spectral lines of periodic signal components of the payload signal contained in the modified received signal positioned symmetrically to the first spectral lines are identified and blanked out of the determined spectrum of the modified received signal.

4. The method according to claim 3, wherein two second spectral lines positioned symmetrically to a first spectral line are identified if, in each case, two spectral lines exist for each identified first spectral line of which intervals in the frequency displacements from the respective first spectral line differ by a maximum of a first threshold value.

5. The method according to claim 4, wherein, in order to identify second spectral lines, the spectral lines with the largest amplitudes in the spectrum of the modified received signal are used respectively as first spectral lines.

6. The method according to claim 3, wherein, in order to increase frequency resolution in determining intervals in the frequency displacements, an FFT length of the Fourier transform is increased.

7. The method according to claim 1, wherein at least two transmitted signals contained in the received signal are detected if, after blanking out second spectral lines, at least three first spectral lines are identified in the spectrum of the modified received signal, of which the amplitudes are respectively a multiple of the mean value of an amplitude of spectral components of non-periodic signal components contained in the modified received signal.

8. The method according to claim 7, wherein at least two transmitted signals are detected in the modified received signal if, after blanking out second spectral lines, at least three spectral lines is disposed in the spectrum of the modified received signal, of which the amplitudes are higher than a significance level such that a second threshold value above the mean value of the amplitudes of the spectral components of the non-periodic signal components contained in the modified received signal.

9. The method according to claim 7, wherein at least two transmitted signals are detected in the modified received signal if, after blanking out second spectral lines, at least three spectral lines are disposed in the spectrum of the modified received signal, which are selected by using a cyclostationary property detection of the non-periodic signal components in the modified received signal.

10. The method according to claim 7, wherein at least two further transmitted signals are detected in the modified received signal if, after blanking out second spectral lines, at least three spectral lines are disposed in the spectrum of the modified received signal, which are selected by using a Jarque-Bera test of the non-periodic signal components in the modified received signal.

11. The method according to claim 1, wherein the nonlinear signal processing is a quadratic signal processing.

12. The method according to claim 1, wherein, for the identification of first and second spectral lines, the spectrum of the modified received signal is analyzed in a frequency range of a second harmonic of the transmitted signals contained in the modified received signal.

13. The method according to claim 1, wherein the nonlinear signal processing is a modulus function.

14. The method according to claim 13, wherein, for the identification of first and second spectral lines, the spectrum of the modified received signal is analyzed in a frequency range surrounding a direct signal component of the modified received signal.

15. A device for detecting at least two transmitted signals contained in a received signal with different frequency displacements, comprising:

a nonlinear signal processing unit for determining a modified received signal through nonlinear signal processing of the received signal;

a Fourier transformer for determining a spectrum of the modified received signal; and a detector for identifying multiple first spectral lines associated respectively with carrier signals, which are distinguishable from spectral components associated with noise signals and payload signals, wherein at least two transmitted signals contained in the received signal are detected if the multiple first spectral lines of carrier signals contained in the modified received signal are identified within the determined spectrum, of which amplitudes are respectively a multiple of the mean value of an amplitude of the spectral components of the noise signals and payload signals contained in the modified received signal.

16. The device according to claim 15, further comprising a unit provided for blanking out from the spectrum of the modified received signal second spectral lines which are positioned symmetrically to the first spectral lines.

17. The device according to claim 15, further comprising a unit provided for implementation of a significance test.

18. The device according to claim 15, further comprising a unit provided for implementation of a cyclostationary property detection.

19. The device according to claim 15, further comprising a unit provided for implementation of a Jarque-Bera test.

* * * * *